(12) United States Patent
Santangelo et al.

(10) Patent No.: US 9,418,984 B2
(45) Date of Patent: Aug. 16, 2016

(54) NORMALLY OFF POWER ELECTRONIC COMPONENT

(71) Applicant: STMicroelectronics S.r.l., Agrate Brianza (IT)

(72) Inventors: Antonello Santangelo, Belpasso (IT); Marcello Francesco Salvatore Giuffrida, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 257 days.

(21) Appl. No.: 14/104,317

(22) Filed: Dec. 12, 2013

(65) Prior Publication Data
US 2014/0167060 A1 Jun. 19, 2014

(30) Foreign Application Priority Data
Dec. 14, 2012 (IT) .............................. TO2012A1081

(51) Int. Cl.
| | |
|---|---|
| *H01L 21/00* | (2006.01) |
| *H01L 27/06* | (2006.01) |
| *H01L 23/495* | (2006.01) |
| *H01L 27/088* | (2006.01) |

(Continued)

(52) U.S. Cl.
CPC ...... *H01L 27/0617* (2013.01); *H01L 23/49562* (2013.01); *H01L 23/49575* (2013.01); *H01L 27/0605* (2013.01); *H01L 27/088* (2013.01); *H01L 27/098* (2013.01); *H01L 29/778* (2013.01); *H01L 29/7816* (2013.01); *H01L 29/808* (2013.01); *H01L 24/05* (2013.01); *H01L 24/06* (2013.01); *H01L 24/32* (2013.01); *H01L 24/48* (2013.01); *H01L 24/49* (2013.01); *H01L 24/73* (2013.01); *H01L 2224/04042* (2013.01); *H01L 2224/05553* (2013.01); *H01L 2224/0603* (2013.01); *H01L 2224/32245* (2013.01); *H01L 2224/48091* (2013.01); *H01L 2224/48137* (2013.01); *H01L 2224/48247* (2013.01); *H01L 2224/48257* (2013.01); *H01L 2224/49111* (2013.01); *H01L 2224/49112* (2013.01); *H01L 2224/49171* (2013.01); *H01L 2224/73265* (2013.01); *H01L 2924/1033* (2013.01); *H01L 2924/12032* (2013.01); *H01L 2924/12036* (2013.01); *H01L 2924/13062* (2013.01); *H01L 2924/13064* (2013.01); *H01L 2924/13091* (2013.01); *H01L 2924/181* (2013.01); *H01L 2924/30107* (2013.01)

(58) Field of Classification Search
CPC ..................... H01L 27/0617; H01L 23/49575; H01L 27/0605; H01L 23/49562; H01L 29/778
See application file for complete search history.

(56) References Cited

U.S. PATENT DOCUMENTS

| | | |
|---|---|---|
| 4,663,547 A | 5/1987 | Baliga et al. |
| 6,797,594 B2 | 9/2004 | Hoshino et al. |

(Continued)

OTHER PUBLICATIONS

Sheng, K. et al., "Design Criteria of High-Voltage Lateral RESURF JFETs on 4H-SiC," IEEE Transactions on Electron Devices 52(10):2300-2308, Oct. 2005.

*Primary Examiner* — Laura Menz
(74) *Attorney, Agent, or Firm* — Seed IP Law Group PLLC

(57) ABSTRACT

An electronic power component including a normally on high-voltage transistor and a normally off low-voltage transistor. The normally on transistor and the normally off transistor are coupled in cascode configuration and are housed in a single package. The normally off transistor is of the bottom-source type.

21 Claims, 6 Drawing Sheets

(51) Int. Cl.
*H01L 27/098* (2006.01)
*H01L 29/778* (2006.01)
*H01L 29/78* (2006.01)
*H01L 29/808* (2006.01)
*H01L 23/00* (2006.01)

(56) References Cited

U.S. PATENT DOCUMENTS

| | | |
|---|---|---|
| 8,084,783 B2 | 12/2011 | Zhang |
| 2001/0012671 A1 | 8/2001 | Hoshino et al. |
| 2002/0190258 A1 | 12/2002 | Harada et al. |
| 2004/0130021 A1 | 7/2004 | Sridevan |
| 2006/0054954 A1 | 3/2006 | Santangelo et al. |
| 2006/0113593 A1 | 6/2006 | Sankin et al. |
| 2008/0230784 A1 | 9/2008 | Murphy |
| 2008/0308838 A1 | 12/2008 | McNutt et al. |
| 2009/0160036 A1 | 6/2009 | Grey |
| 2010/0032816 A1 | 2/2010 | Mahler et al. |
| 2010/0117095 A1 | 5/2010 | Zhang |
| 2011/0049580 A1 | 3/2011 | Lui et al. |
| 2012/0043553 A1 | 2/2012 | Lidow et al. |
| 2012/0199875 A1 | 8/2012 | Bhalla et al. |
| 2012/0223321 A1 | 9/2012 | Lin et al. |
| 2012/0256188 A1 | 10/2012 | McDonald et al. |
| 2012/0256189 A1* | 10/2012 | McDonald ............ H01L 25/074 257/76 |
| 2013/0187627 A1* | 7/2013 | Imada ................... H01L 27/088 323/311 |
| 2014/0175454 A1* | 6/2014 | Roberts ................. H01L 25/18 257/76 |

* cited by examiner

NORMALLY OFF POWER ELECTRONIC COMPONENT

BACKGROUND

1. Technical Field

The present disclosure relates to a normally off power electronic component.

2. Description of the Related Art

In order to provide bridge and half-bridge structures in high-voltage switching circuits, there is an increasingly widespread use of high-performance power field-effect transistors, such as, for example, high-voltage JFETs in SiC substrate or MOSFETs in GaN substrate with high electron mobility (HEMTs, High Electron Mobility Transistors). Transistors of this kind, albeit extremely efficient and suitable for operating with voltages, for example, in the region of 600-1200 V, present, however, the disadvantage of being normally on. In other words, if a specific quenching voltage is not applied on the control terminals, normally on devices enable passage of current in the presence of a potential difference between their conduction terminals. Given the high voltages involved, it is thus possible to create risky conditions, for example, when the driving circuits that supply the control terminals are subject to malfunctioning or disturbance that prevent proper operation, even just for limited periods of time.

In order to prevent these drawbacks, normally on high-voltage transistors are frequently used in combination with a normally off low-voltage transistor, which prevents passage of current in the absence of control. The two transistors are coupled to one another in cascode configuration and are incorporated in one and the same package to form a single discrete power component. With reference, for simplicity, to N-channel field-effect transistors, the normally off low-voltage transistor has its source terminal connected to a reference-potential line (ground) and its drain terminal connected to a source terminal of the normally on high-voltage transistor. The gate terminal of the normally off transistor receives a control signal from a driving circuit, whereas the gate terminal of the normally on transistor is connected to ground. In the absence of the control signal, the normally off transistor, which is connected in series to the normally on transistor, prevents passage of current and forces turning-off of the entire discrete component.

The normally on transistor and the normally off transistor are as a rule provided in separate chips and incorporated in a single package, provided with connection terminals. The normally off transistor and the normally on transistor are carried on one and the same conductive lamina incorporated in the package and are connected together, to the conductive lamina, and to the connection terminals by wire connections.

Known solutions are, however, rather complex, both owing to insulating at least the normally off transistor from the conductive lamina and on account of the number of wire connections. Moreover, the wire connections have associated to them non-negligible parasitic inductances.

There is hence an interest in simplifying the structure of the power component so as to reduce both the wire connections and, consequently, the parasitic inductances.

BRIEF SUMMARY

One embodiment of the present disclosure is an electronic power component that enables the limitations described above to be overcome.

According to one embodiment of the present disclosure, an electronic power component includes a conductive plate, a first semiconductor chip, a high-voltage normally on transistor, and a low-voltage normally off transistor formed in the first semiconductor ship and coupled in cascode configuration with the normally on transistor. The chip has first and second faces opposite to each other, and the second face is bonded to the conductive plate. The normally off transistor is a bottom source transistor having a drain terminal and a gate terminal on the first face of the first semiconductor chip and a source terminal on the second face of the first semiconductor chip and conductively connected to the conductive plate.

BRIEF DESCRIPTION OF THE SEVERAL VIEWS OF THE DRAWINGS

For a better understanding of the disclosure, some embodiments thereof will now be described purely by way of non-limiting example and with reference to the attached drawings, wherein.

DETAILED DESCRIPTION

Figure 1:
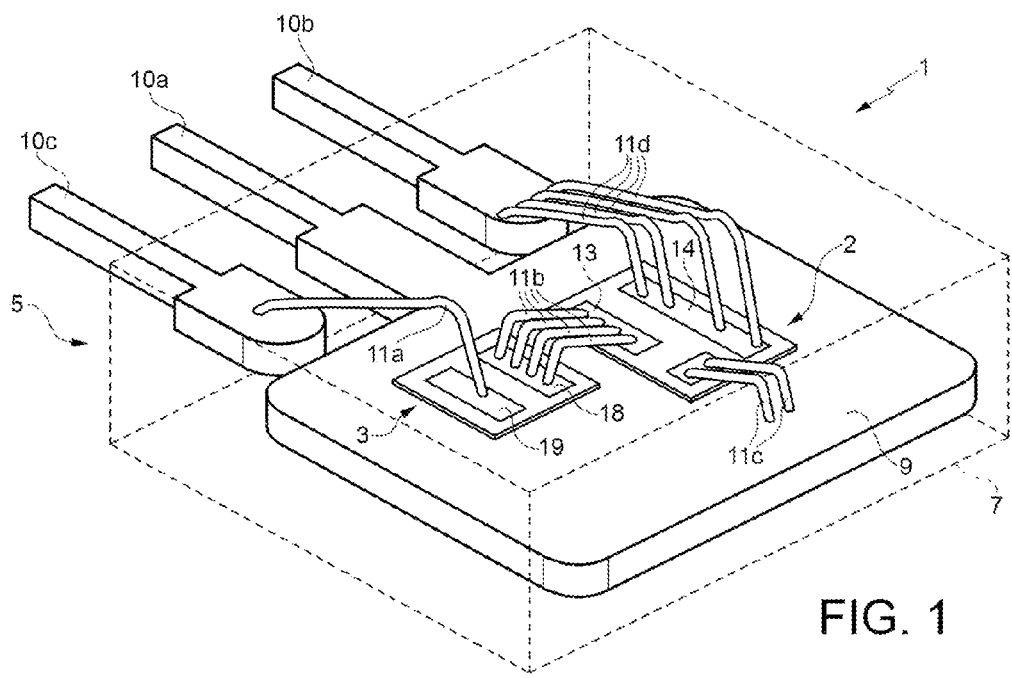
FIG. 1 is a simplified perspective view, with parts removed for reasons of clarity, of an electronic power component according to one embodiment of the present disclosure.
Figure 2:
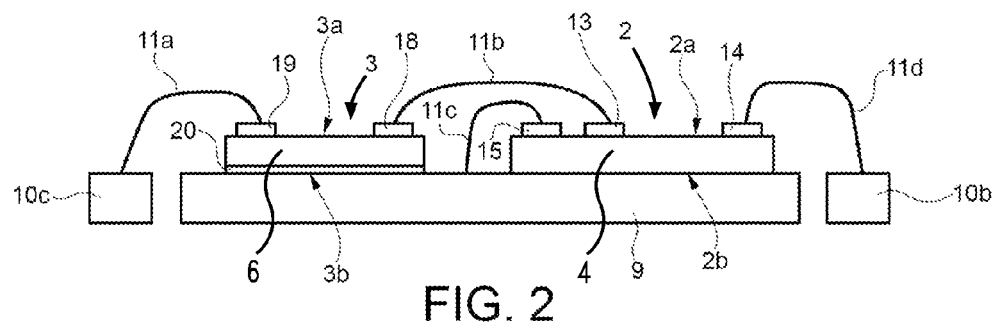
FIG. 2 is a simplified side view of the electronic power component of FIG. 1.

With reference to FIGS. 1 and 2, a normally off discrete power component, designated as a whole by number 1, comprises a normally on transistor 2 and a normally off transistor 3, incorporated in a single package 5. In turn, the package 5 comprises a casing 7, indicated in a simplified way with a dashed line, a metal plate 9 contained in the casing 7, and a plurality of leads 10 that extend outside the casing 7. In one embodiment, three leads 10a, 10b, 10c are present, one of which (10a) is made of a single piece with the metal plate 9.

The normally on transistor 2 and the normally off transistor 3 are provided in distinct semiconductor chips 4, 6 and are both set on the metal plate 9. Connection of the normally on transistor 2 and of the normally off transistor 3 together, to the metal plate 9, and to the leads 10b, 10c is obtained by wire connections 11a-11d provided by wire bonding.

The normally on transistor 2 is a high-voltage transistor and is able to withstand voltages, for example, of up to 1200 V. In one embodiment, the normally on transistor 2 is a depletion GaN HEMT and has its source terminal 13, drain terminal 14, and gate terminal 15 all on a first face (front) 2a of the chip 4, opposite to the metal plate 9. A second face (back) 2b opposite to the first face 2a is adjacent to the metal plate 9.

The normally off transistor 3 is of the low-voltage bottom-source type. In particular, the normally off transistor 3 has its drain terminal 18 and gate terminal 19 on a first face 3a of the respective chip and its source terminal 20 on a second face 3b opposite to the first face 3a. In one embodiment, the normally off transistor 3 is a laterally-diffused metal oxide semiconductor (LDMOS) transistor. The second face 3b of the normally off transistor 3 is joined to the metal plate 9 by a conductive joint. Consequently, the source terminal 20 of the normally off transistor 3 and the metal plate 9 are electrically connected in a substantially direct way.

Figure 3:
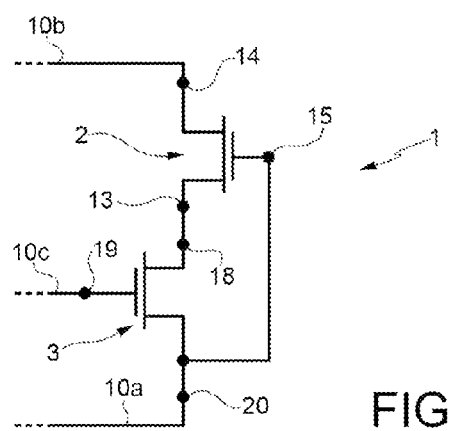
FIG. 3 is an electrical diagram regarding the component of FIG. 1.

The normally on transistor 2 and the normally off transistor 3 are connected together in cascode configuration, as shown in FIG. 3. In practice, the gate terminal 19 of the normally off transistor 3 is connected to the lead 10c via the wire connections 11a, and the drain terminal 18 is connected to the source terminal 13 of the normally on transistor 2 via the wire connections 11b. The source terminal 20 of the normally off transistor 3 is instead connected, via the metal plate 9, to the lead 10a.

The normally on transistor 2 has its gate terminal 15 connected to the source terminal 20 of the normally off transistor 3 (via the wire connections 11c and the metal plate 9). The drain terminal 14 of the normally on transistor 2 is connected to the lead 10b via the wire connections 11d.

Use of a bottom-source transistor (in practice with the source terminal on the back of the chip) as normally off transistor enables the problem of insulation of the drain terminal from the metal plate 9 to be overcome and, at the same time, enables reduction of the number of wire connections and the parasitic inductances.

Unlike what occurs in conventional normally off discrete power components, in the normally off transistor 3 the second face 3b facing the plate defines the source terminal 20 (and not the drain terminal). The drain terminal 18 is, instead, arranged on the first face 3a, opposite to the metal plate 9, and hence there is no need to provide a purposely designed insulation. In addition, given that between the source terminal 20 of the normally off transistor 3 and the metal plate 9 a direct electrical connection is made, it is sufficient to provide a conductive connection joint. It is not necessary, instead, to provide a dedicated wire connection, thus obtaining a benefit also in terms of reduction of the parasitic inductance.

Figure 4:
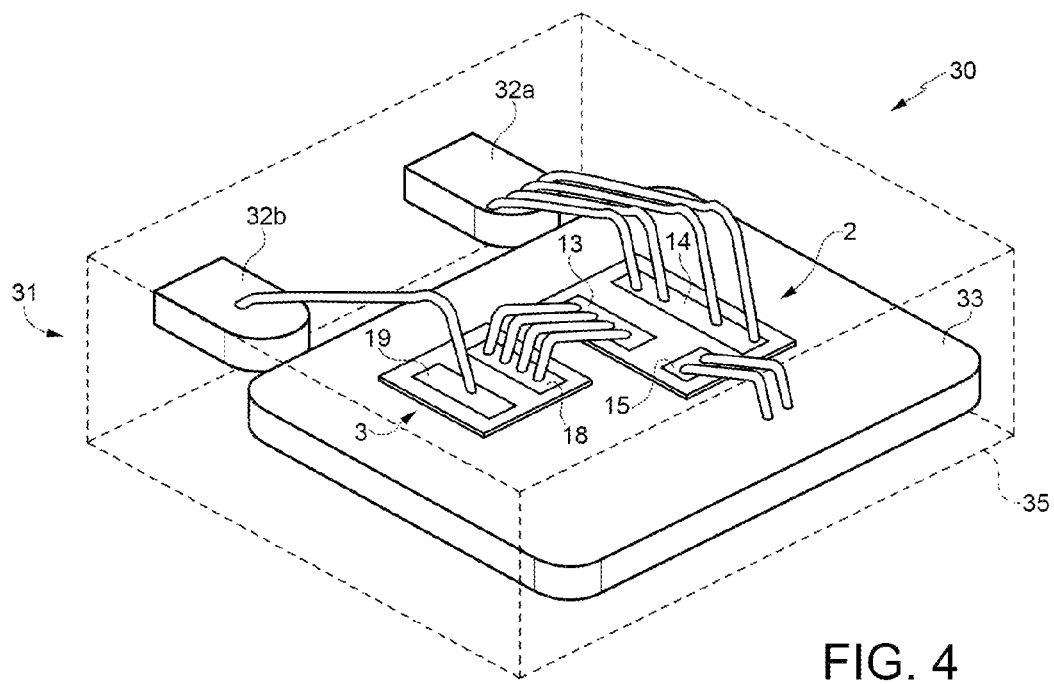
FIG. 4 is a simplified perspective view, with parts removed for reasons of clarity, of an electronic power component according to a different embodiment of the present disclosure.

In the embodiment of FIG. 4, the normally on transistor 2 and the normally off transistor 3 of a normally off power component 30 are housed in a package 31 having two leads 32a, 32b. In particular, the normally on transistor 2 and the normally off transistor 3 are arranged on a metal plate 33 incorporated in a casing 35 of the package 31.

Figure 5:
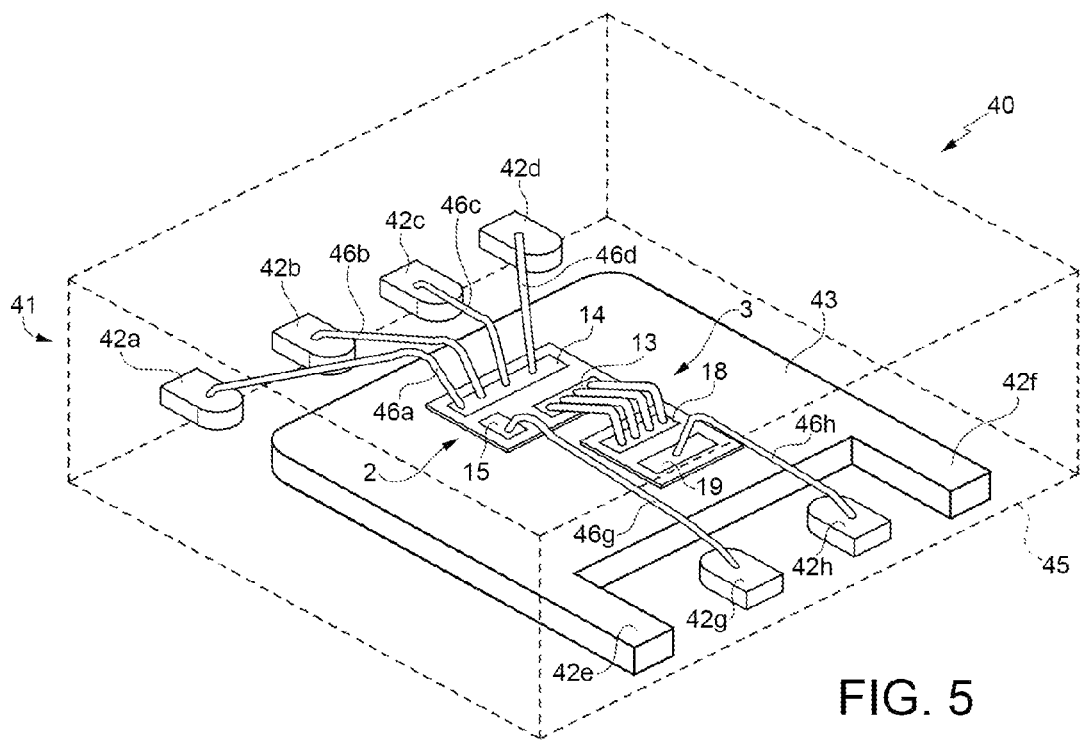
FIG. 5 is a simplified perspective view, with parts removed for reasons of clarity, of an electronic power component according to a further different embodiment of the present disclosure.
Figure 6:
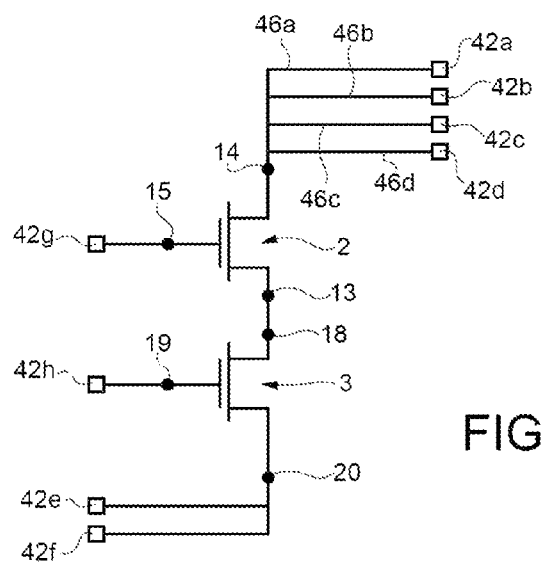
FIG. 6 is an electrical diagram regarding the component of FIG. 5.

In the embodiment of FIG. 5, the normally on transistor 2 and the normally off transistor 3 of a power component 40 are housed in a package 41 for integrated circuits, which comprises a casing 45, a metal plate 43, and a plurality of connection pins 42a-42h (eight, in the example illustrated). The connection pins 42a-42h are arranged in the same number on opposite sides of the metal plate 43 and of the casing 45. In one embodiment, the connection pins 42a-42d that are on a first side of the metal plate 43 are connected to the drain terminal 14 of the normally on transistor 2 by respective wire connections 46a-46d. Two connection pins 42e, 42f on a second side of the metal plate 43 are made of a single piece with the latter. The other two connection pins 42g, 42h are connected to the gate terminal 15 of the normally on transistor 2 by wire connections 46g and to the gate terminal 19 of the normally off transistor 3 by wire connections 46g, as shown in FIG. 6. In this way, the gate terminals 15, 19 of the normally on transistor 2 and of the normally off transistor 3 are independently accessible from outside.

Figure 7:
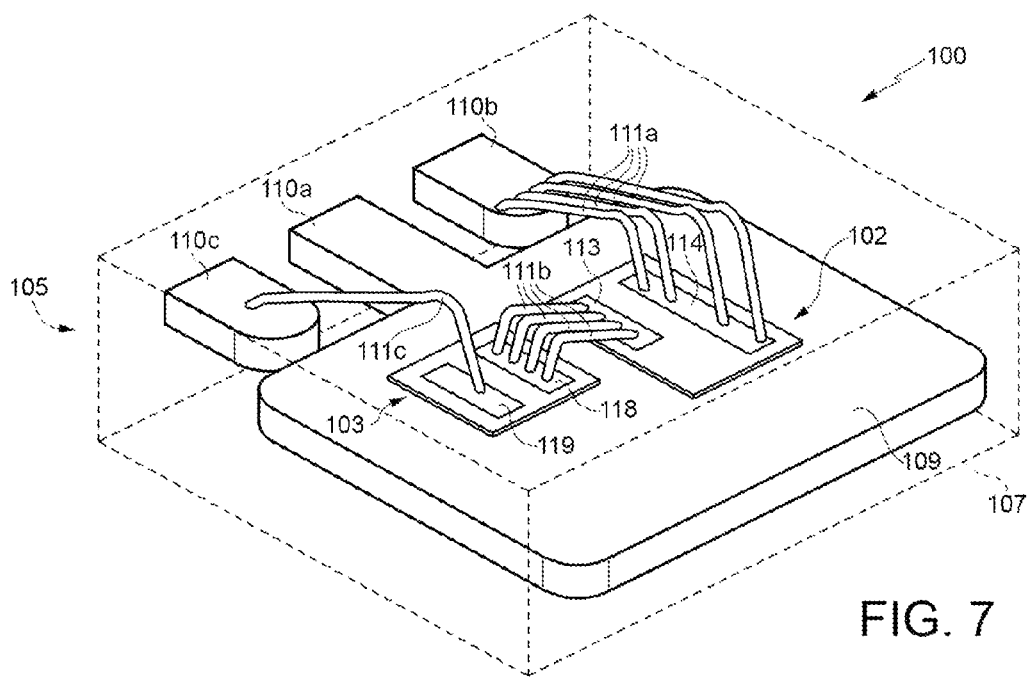
FIG. 7 is a simplified perspective view, with parts removed for reasons of clarity, of an electronic power component according to a further different embodiment of the present disclosure.
Figure 8:
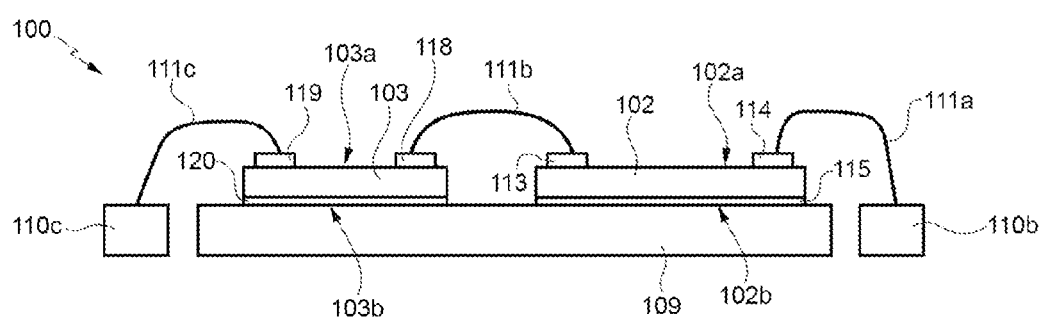
FIG. 8 is a simplified side view of the electronic power component of FIG. 7.

FIGS. 7 and 8 illustrate a further embodiment of the disclosure. In this case, a normally off power component 100 comprises a normally on transistor 102 and a normally off transistor 103 incorporated in one and the same package 105. In turn, the package 105 comprises a casing 107, a metal plate 109 contained in the casing 107, and a plurality of leads 110 (three in the example illustrated) that extends outside the casing 107. One of the leads (110a) is made of a single piece with the metal plate 109.

The normally on transistor 102 is a power JFET of the horizontal bottom-gate type. In particular, the normally on transistor 102 has its source terminal 113 and drain terminal 114 on a first face 102a (FIG. 8), opposite to the metal plate 109, and its gate terminal 115 on a second face 102b, opposite to the first face 102a and adjacent to the metal plate 109. In addition, the gate terminal 115 is electrically connected to the metal plate 109 through a conductive joint (not shown).

The normally off transistor 103 is a low-voltage bottom-source LDMOS transistor, as already described.

The normally on transistor 102 and the normally off transistor 103 are connected in cascode configuration, similarly to what is shown in FIG. 3. In this case, however, the gate terminal 115 of the normally on transistor 102 is directly connected to the plate 109 and, through the latter, to the source terminal 120 of the normally off transistor 103. No wire connection between the gate terminal 115 of the normally on transistor 102 and the source terminal 120 of the normally off transistor 103 is hence required. For the rest, the normally on transistor 102 has its drain terminal 114 connected to the lead 110b through wire connections 111a and its source terminal 113 connected to the drain terminal 118 of the normally off transistor 103 through wire connections 111b.

In addition, the normally off transistor 103 has its gate terminal 119 connected to the lead 110c through wire connections 111c.

The configuration described hence enables saving of a further wire connection.

Figure 9:
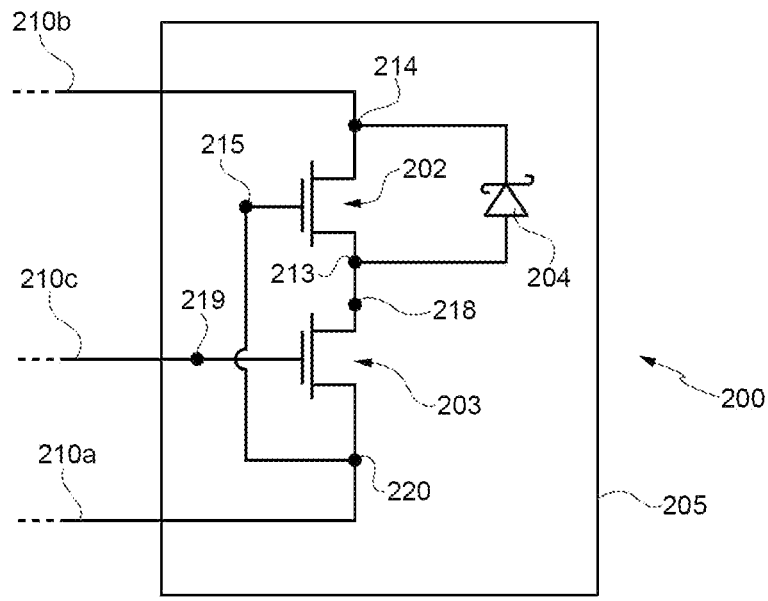
FIG. 9 is an electrical diagram regarding an electronic power component according to a further different embodiment of the present disclosure.
Figure 10:
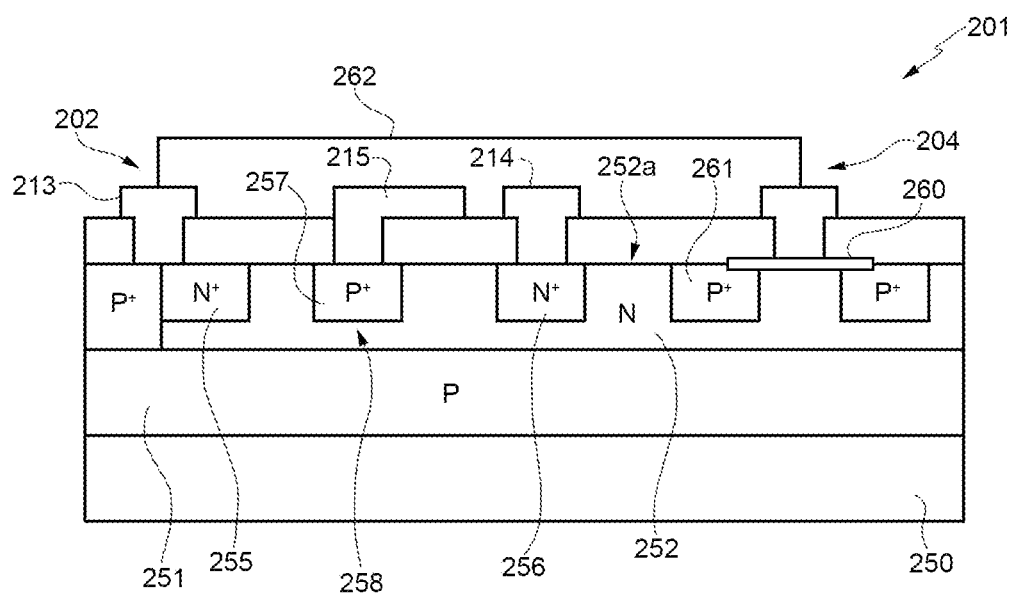
FIG. 10 is a cross section through a chip incorporating a portion of the electronic power component of FIG. 9.

In the embodiment illustrated in FIGS. 9 and 10, a normally off power component 200 comprises a normally on transistor 202 and a normally off transistor 203 in cascode configuration, provided in separate chips and incorporated in a single package 205 provided with leads 210a, 210b, 210c (here illustrated only schematically). In particular, the normally on transistor 202 has its source terminal 213, drain terminal 214, and gate terminal 215 connected, respectively, to a drain terminal 218 of the normally off transistor 203, to the lead 210b, and to the lead 210a. The normally off transistor 203 moreover has its gate terminal 219 and source terminal 220 connected, respectively, to the lead 210c and to the lead 210a.

The normally on transistor 202 is a lateral power JFET and has, integrated in the same chip 201 (FIG. 10), a Schottky diode 204. In particular, the Schottky diode 204 has its anode and cathode connected, respectively, to the source terminal 213 and to the drain terminal 214 of the normally on transistor 202.

In detail, the chip 201 in which the normally on transistor 202 is integrated comprises a semi-insulating substrate 250, arranged on which are, in order, a conductive layer of a P type 251 and a drift layer 252 of an N type.

A source region 255, a drain region 256, and a gate region 257 are provided in the drift layer 252 and emerge on a surface 252a of the latter. A channel region 258 is defined in the drift layer 252 between the source region 255 and the drain region 256, which are both of an N+ type. The gate region 257, of a P+ type, which is also arranged between the source region 255 and the drain region 256, extends between the surface 252a of the drift layer 252 and the channel region 258.

Also the Schottky diode 204 is integrated in the chip 201 and comprises a metal anode terminal 260, formed on the drift layer 252 and surrounded by a guard ring 261 of a P+ type. The anode terminal 260 is connected to the source terminal 213 of the normally on transistor 202 through a connection line 262 on the chip 201 (represented only schematically in FIG. 10). The cathode terminal of the Schottky diode 204 is defined by the drain terminal 214 of the normally on transistor 202.

The Schottky diode 204 may be easily integrated in the chip 201 of the normally on transistor 202 and enables optimal use of the device in the third quadrant, reducing the voltage on the resulting diode in the conduction state. Source and gate regions of the normally on transistor 202 form, in fact, a PN diode that is arranged parallel to the Schottky diode.

Figure 11:
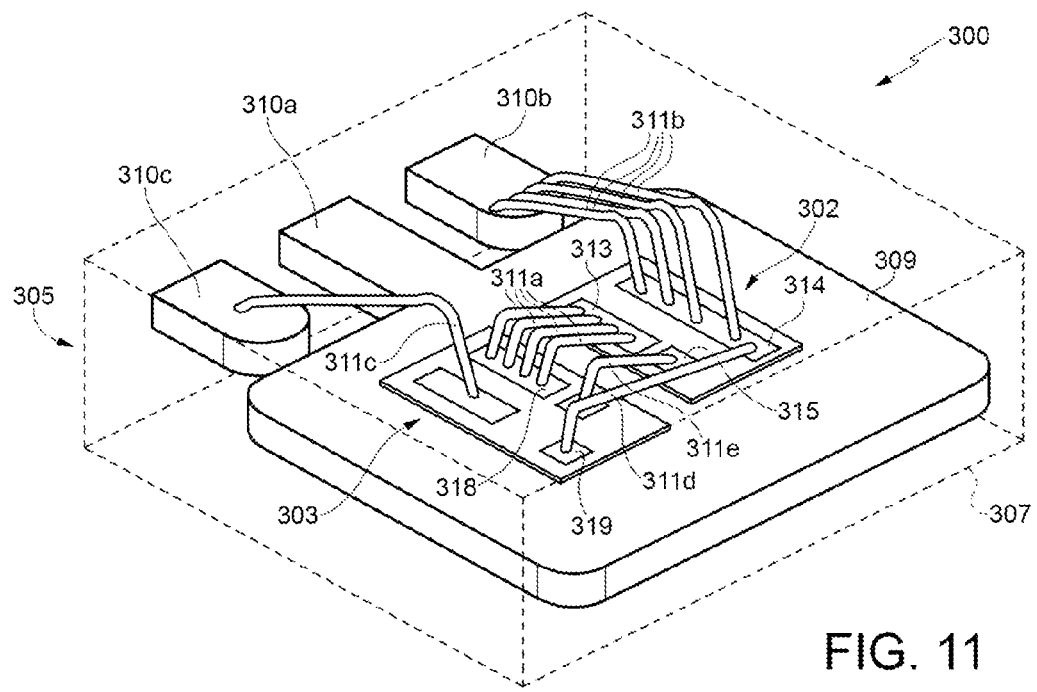
FIG. 11 is a simplified perspective view, with parts removed for reasons of clarity, of an electronic power component according to a further different embodiment of the present disclosure.
Figure 12:
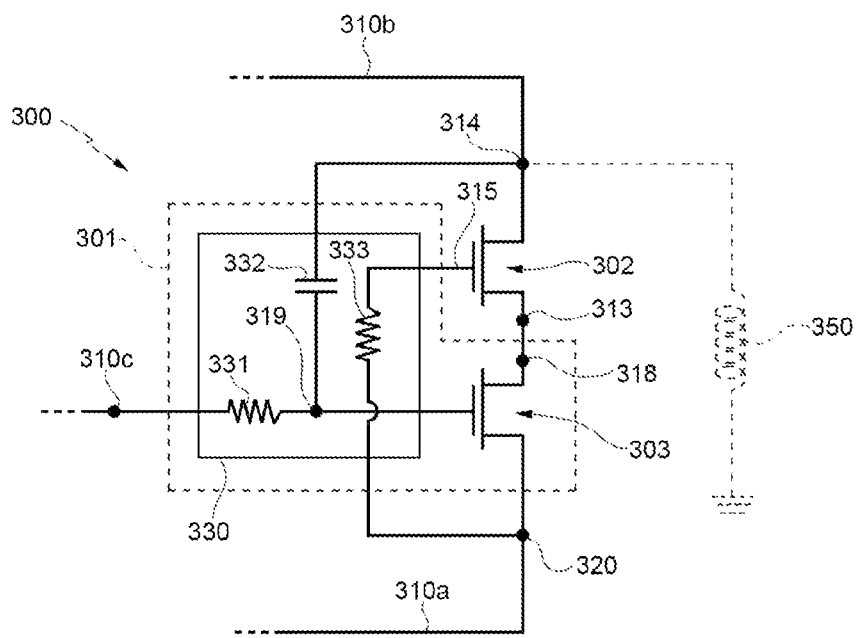
FIG. 12 is an electrical diagram of the component of FIG. 11.

FIGS. 11 and 12 illustrate a further embodiment of the disclosure. A normally off power component 300 comprises a normally on transistor 302 and a normally off transistor 303 in cascode configuration, provided in separate chips and incorporated in a single package 305 provided with leads 310a, 310b, 310c (here illustrated only schematically).

The package 305 comprises a casing 307 and a metal plate 309 on which the chips of the normally on transistor 302 and of the normally off transistor 303 are arranged.

The normally on transistor 302 is a high-voltage transistor, for example, a GaN depletion HEMT, whereas the normally off transistor 303 is of the low-voltage bottom-source type, in particular an LDMOS transistor.

As has been mentioned, the normally on transistor 302 and the normally off transistor 303 are connected together in cascode configuration. In practice, a drain terminal 318 of the normally off transistor 303 is connected to a source terminal 313 of the normally on transistor 302 via wire connections 311a. A source terminal 320 of the normally off transistor 303 is, instead, connected, via the metal plate 309, to the lead 310a.

The normally on transistor 302 has its drain terminal 314 connected to the lead 310b via wire connections 311b.

As shown in greater detail in FIG. 12, integrated in the chip (here designated by 301) that houses the normally off transistor 303 is also a control circuit 330. The control circuit 330 is coupled to the normally on transistor 302 and to the normally off transistor 303 and is configured to slow down the transfer of charge towards the gate-source capacitance of the normally off transistor 303 during the turning-on step and to slow down removal of charge from the gate-source capacitance of the normally on transistor 302 during the turning-off step.

In one embodiment, the control circuit 330 comprises a first resistor 331, a capacitor 332, and a second resistor 333. The first resistor 331 and the capacitor 332 connect the gate terminal 319 of the normally off transistor 302 respectively to the lead 310c, via wire connections 311c, and to the drain terminal 314 of the normally on transistor 302 (and hence to the lead 310b), via wire connections 311d. The second resistor 333 is connected between the gate terminal 315 of the normally on transistor 302 and the source terminal 318 of the normally off transistor 303, via wire connections 311e (given that the source terminal 318 is on the face of the chip housing the normally off transistor 303 in contact with the metal plate 309, the connection is provided on a free face of the chip itself and completed with a deep contact, here not shown).

Figure 13:
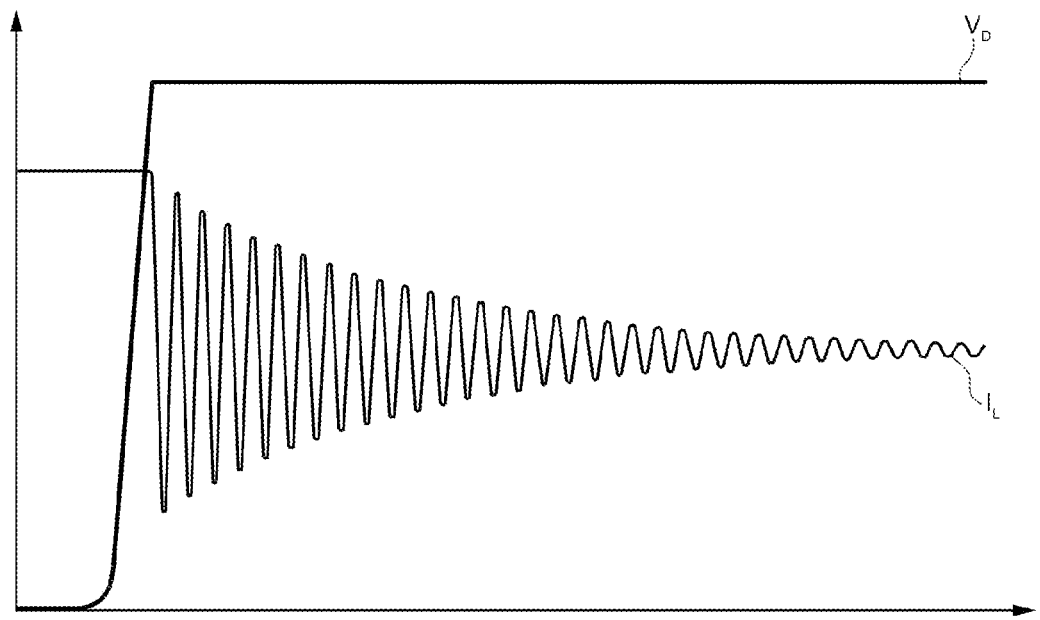
FIG. 13 is a graph that shows quantities regarding the known electronic power component.

In many applications, excessively fast switchings between the on and off states may cause problems, also considering the high voltages involved. Mainly, too steep edges may trigger oscillations in the presence of inductive loads (350 in FIG. 12), turning-on of parasitic components, and, in general, significant electromagnetic disturbance in the environment. FIG. 13 shows by way of example oscillations of the current ($I_L$) on an inductive load in response to a fast turning-off of the power component 300 (ascending ramp of the voltage $V_D$ on the drain terminal 314 of the normally on transistor 302).

The control circuit 330, by slowing down injection and extraction of charge into/from the gate-source capacitance of the normally on transistor 302 and of the normally off transistor 303, enables less fast transitions to be obtained and hence significant reduction of the potential negative effects.

Figure 14:
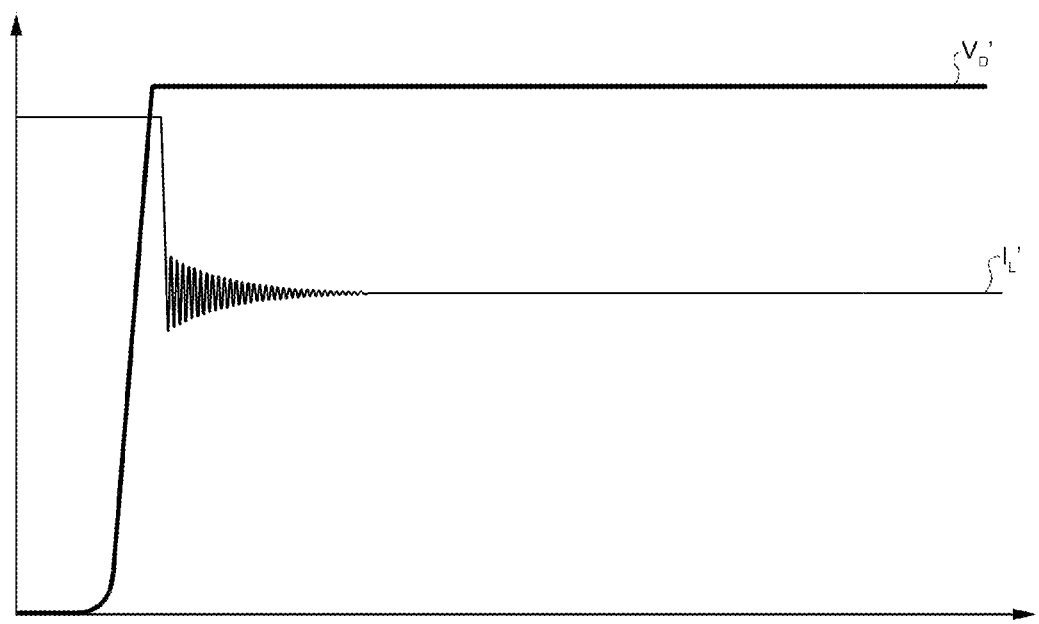
FIG. 14 is a graph that shows quantities regarding the electronic power component of FIG. 12.

In particular, in the example illustrated in FIG. 12, the resistor 331 and the capacitor 332 control the ascending and descending ramps dv/dt of the output voltage. In addition, if a second resistor 333 is considered, there is a further decrease in the current oscillations. By selecting the values of resistance of the first resistor 331 and of the second resistor 333 and the value of capacitance of the capacitor 332, it is thus possible to eliminate or reduce substantially any possible undesirable effects linked to switching of the power components 300, as shown in FIG. 14 (where the current on the load and the voltage on the drain terminal 314 of the normally on transistor 302 are designated, respectively, by $I_L'$ and $V_D'$). In particular, studies have shown that it is possible to obtain a significant slowing-down of the turning-on and turning-off edges and substantial elimination of the oscillations of the current on the load with values of resistance of approximately 50 Ω and a capacitance of approximately 4 pF (with swings of approximately 300 V of the voltage on the drain terminal of the normally on transistor).

The control circuit 330 moreover presents the advantage of being very simple and easy to integrate in the chip 301 of the normally off transistor 303. It is understood, however, that the solution described and illustrated represents a non-limiting example and that the control circuit could be provided in a different way.

Modifications and variations may be made to the electronic power component described, without thereby departing from the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A power electronic component, comprising:
   a conductive plate;
   a first semiconductor chip having first and second faces opposite to each other, the second face being arranged on and supported by the conductive plate;
   a second semiconductor chip supported by the conductive plate;
   a high-voltage normally on transistor formed in the second semiconductor chip; and
   a low-voltage normally off transistor formed in the first semiconductor chip and coupled in cascode configuration with the normally on transistor, the normally off transistor being a bottom source transistor having a drain terminal and a gate terminal on the first face of the first semiconductor chip and a source terminal on the second face of the first semiconductor chip, the source terminal being conductively connected to the conductive plate.

2. A component according to claim 1, wherein the normally off transistor is an LDMOS transistor.

3. A component according to claim 1, comprising a control circuit integrated in the first semiconductor chip.

4. A component according to claim 3, wherein the control circuit is coupled to the normally on transistor and to the normally off transistor and is configured to slow down a charge transfer toward a gate-source capacitance of the normally off transistor during a turn-on stage and to slow down a charge removal from a gate-source capacitance of the normally on transistor during a turn-off stage.

5. A component according to claim 4, having a first connection terminal and a second connection terminal; wherein:
   the control circuit includes a first resistor, a capacitor and a second resistor;
   the first resistor is electrically coupled between the gate terminal of the normally off transistor and the first connection terminal;
   the capacitor is electrically coupled between the gate terminal of the normally off transistor and a drain terminal of the normally on transistor; and
   the second resistor is electrically coupled between a control terminal of the normally on transistor and the source terminal of the normally off transistor.

6. A component according to claim 1, wherein the normally on transistor is a GaN HEMT transistor.

7. A component according to claim 1, wherein the normally on transistor is a horizontal bottom gate JFET transistor.

8. A component according to claim 1, wherein the normally on transistor is a lateral JFET transistor.

9. A component according to claim 8, further comprising a Schottky diode integrated in the second semiconductor chip.

10. A component according to claim 9, wherein:
    the second semiconductor chip includes a drift layer;
    the normally on transistor includes a source region, a drain region, a gate region and a channel region, accommodated in the drift layer and flush with a surface of the drift layer;
    an anode terminal of the Schottky diode is arranged on the drift layer at a distance from the normally on transistor; and
    a cathode terminal of the Schottky diode is defined by the drain terminal of the normally on transistor.

11. A component according to claim 10, wherein the anode terminal of the Schottky diode is connected to the source terminal of the normally on transistor.

12. A packaged power electronic component, comprising:
    a conductive plate;
    a first semiconductor chip having first and second faces opposite to each other, the second face being arranged on the conductive plate;
    a second semiconductor chip arranged on the conductive plate;
    a high-voltage normally on transistor formed in the second semiconductor chip;
    a low-voltage normally off transistor formed in the first semiconductor chip and coupled in cascode configuration with the normally on transistor, the normally off transistor being a bottom source transistor having a drain terminal and a gate terminal on the first face of the first semiconductor chip and a source terminal on the second face of the first semiconductor chip, the source terminal being conductively connected to the conductive plate;
    a plastic casing that houses the conductive plate, first semiconductor chip, normally on transistor, and normal off transistor; and
    first and second leads electrically coupled to the normal on and normally off transistors, respectively, and extending outwardly from the plastic casing.

13. The packaged power electronic component of claim 12, comprising a control circuit integrated in the first semiconductor chip, coupled to the normally on transistor and to the normally off transistor, and configured to slow down a charge transfer toward a gate-source capacitance of the normally off transistor during a turn-on stage and to slow down a charge removal from a gate-source capacitance of the normally on transistor during a turn-off stage.

14. The packaged power electronic component of claim 13, wherein the control circuit includes:
    a first resistor electrically coupled between the gate terminal of the normally off transistor and the first lead;
    a capacitor electrically coupled between the gate terminal of the normally off transistor and a drain terminal of the normally on transistor; and
    a second resistor electrically coupled between a control terminal of the normally on transistor and the source terminal of the normally off transistor.

15. The packaged power electronic component of claim 12, wherein the component further includes a Schottky diode integrated in the second semiconductor chip.

16. The packaged power electronic component of claim 15, wherein:
    the second semiconductor chip includes a drift layer;
    the normally on transistor includes a source region, a drain region, a gate region and a channel region, accommodated in the drift layer and flush with a surface of the drift layer;
    an anode terminal of the Schottky diode is arranged on the drift layer at a distance from the normally on transistor; and
    a cathode terminal of the Schottky diode is defined by the drain terminal of the normally on transistor.

17. The packaged power electronic component of claim 16, wherein the anode terminal of the Schottky diode is connected to the source terminal of the normally on transistor.

18. A power electronic component, comprising:
    a conductive plate;
    a first semiconductor chip having first and second faces opposite to each other, the second face being arranged on the conductive plate;
    a second semiconductor chip arranged on the conductive plate;

a high-voltage normally on transistor formed in the second semiconductor chip; and a low-voltage normally off transistor formed in the first semiconductor chip and coupled in cascade configuration with the normally on transistor, the normally off transistor being a bottom source transistor having a drain terminal and a gate terminal on the first face of the first semiconductor chip and a source terminal on the second face of the first semiconductor chip, the source terminal being conductively connected to the conductive plate, wherein the normally on transistor is formed in a second semiconductor chip arranged on the conductive plate and the normally on transistor is a GaN HEMT transistor.

19. A component according to claim 18, wherein the normally off transistor is an LDMOS transistor.

20. A component according to claim 18, comprising a control circuit integrated in the first semiconductor chip, wherein the control circuit is coupled to the normally on transistor and to the normally off transitory and is configured to slow down a charge transfer toward a gate-source capacitance of the normally off transistor during a turn-on stage and to slow down a charge removal from a gate-source capacitance of the normally on transistor during a turn-off stage.

21. A component according to claim 20, having a first connection terminal and a second connection terminal; wherein:

the control circuit includes a first resistor, a capacitor and a second resistor;

the first resistor is electrically coupled between the gate terminal of the normally off transistor and the first connection terminal;

the capacitor is electrically coupled between the gate terminal of the normally off transistor and a drain terminal of the normally on transistor; and the second resistor is electrically coupled between a control terminal of the normally on transistor and the source terminal of the normally transistor.

\* \* \* \* \*